(12) United States Patent
Lee et al.

(10) Patent No.: US 10,476,460 B2
(45) Date of Patent: Nov. 12, 2019

(54) LOW-NOISE AMPLIFIER HAVING PROGRAMMABLE-PHASE GAIN STAGE

(71) Applicant: SKYWORKS SOLUTIONS, INC., Woburn, MA (US)

(72) Inventors: Junhyung Lee, Irvine, CA (US); Johannes Jacobus Emile Maria Hageraats, Kamuela, HI (US); Joshua Haeseok Cho, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/688,373

(22) Filed: Aug. 28, 2017

(65) Prior Publication Data

US 2018/0062599 A1 Mar. 1, 2018

Related U.S. Application Data

(60) Provisional application No. 62/381,353, filed on Aug. 30, 2016.

(51) Int. Cl.
| | |
|---|---|
| *H03F 1/22* | (2006.01) |
| *H03G 3/30* | (2006.01) |
| *H03F 3/195* | (2006.01) |
| *H03F 3/213* | (2006.01) |
| *H03F 1/32* | (2006.01) |
| *H03F 1/56* | (2006.01) |
| *H03F 3/72* | (2006.01) |
| *H03G 1/00* | (2006.01) |
| *H03G 3/00* | (2006.01) |

(52) U.S. Cl.
CPC .......... *H03G 3/3042* (2013.01); *H03F 1/223* (2013.01); *H03F 1/3205* (2013.01); *H03F 1/565* (2013.01); *H03F 3/195* (2013.01); *H03F 3/213* (2013.01); *H03F 3/72* (2013.01); *H03G 1/0029* (2013.01); *H03G 1/0088* (2013.01); *H03G 3/001* (2013.01); *H03G 3/3063* (2013.01); *H03F 2200/213* (2013.01); *H03F 2200/294* (2013.01); *H03F 2200/451* (2013.01); *H03F 2200/456* (2013.01); *H03F 2200/489* (2013.01); *H03F 2203/7236* (2013.01)

(58) Field of Classification Search
CPC .......... H03F 3/191; H03F 3/193; H03F 3/195; H03F 1/22; H03F 1/223
USPC .......................................... 330/285, 305, 311
See application file for complete search history.

(56) References Cited

U.S. PATENT DOCUMENTS

| | | | | |
|---|---|---|---|---|
| 5,256,987 A | * | 10/1993 | Kibayashi | ............... H03F 3/602 330/284 |
| 2006/0097792 A1 | * | 5/2006 | Ryu | ..................... H03G 1/0029 330/311 |
| 2008/0297259 A1 | | 12/2008 | Mu | |

(Continued)

OTHER PUBLICATIONS

ISR and WOSA dated Jan. 9, 2018 for PCT/US2017/048902.

*Primary Examiner* — Steven J Mottola
(74) *Attorney, Agent, or Firm* — Chang & Hale LLP

(57) ABSTRACT

Low-noise amplifier having programmable-phase gain stage. In some embodiments, a radio-frequency amplifier can include an input node, an output node, and a programmable-phase gain stage implemented between the input node and the output node. The programmable-phase gain stage can be configured to operate in one of a plurality of gain settings, and to provide a desired phase for a signal at each of the plurality of gain settings.

15 Claims, 14 Drawing Sheets

(56) References Cited

U.S. PATENT DOCUMENTS

| | | |
|---|---|---|
| 2010/0141337 A1 | 5/2010 | Chen |
| 2010/0327977 A1 | 12/2010 | Godbole |
| 2013/0300499 A1* | 11/2013 | Sharawi .................... H03F 3/68 |
| | | 330/124 R |
| 2014/0085006 A1* | 3/2014 | Mostov ................ H03F 1/0227 |
| | | 330/295 |
| 2014/0333384 A1* | 11/2014 | Gill ........................ H03F 3/195 |
| | | 330/296 |
| 2015/0084194 A1 | 3/2015 | Molzer et al. |
| 2015/0237683 A1 | 8/2015 | Polato et al. |

* cited by examiner

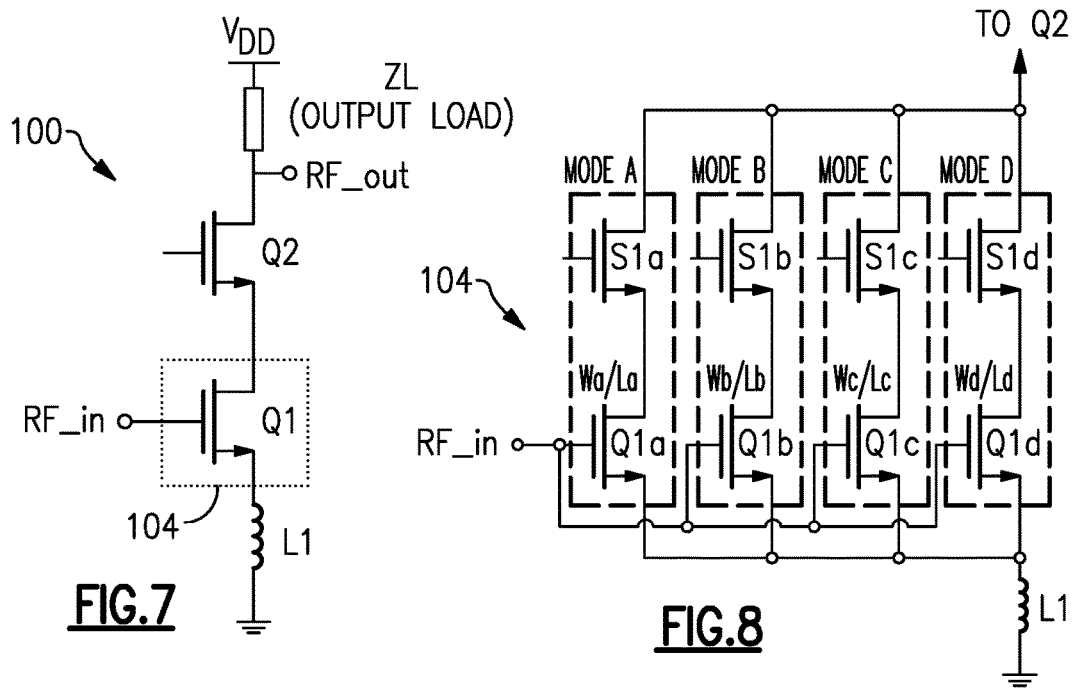
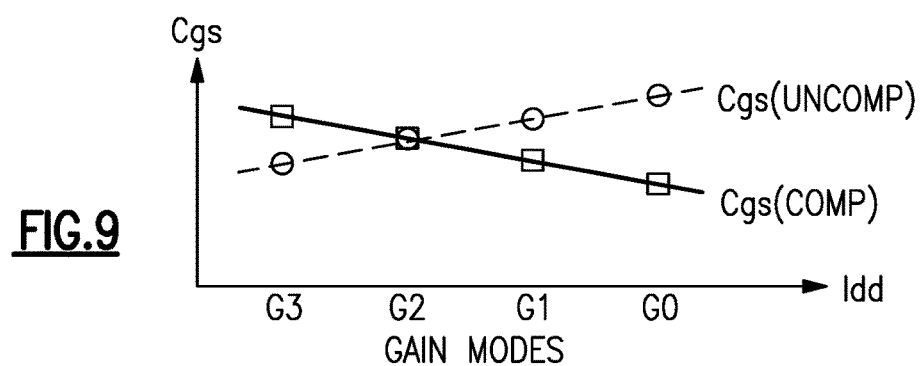
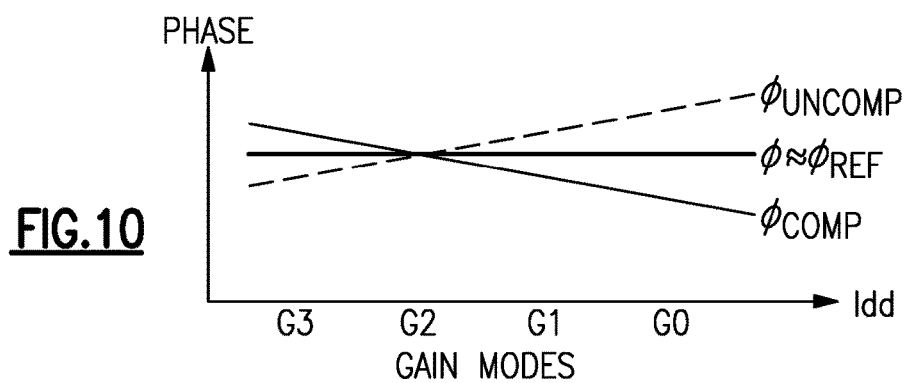

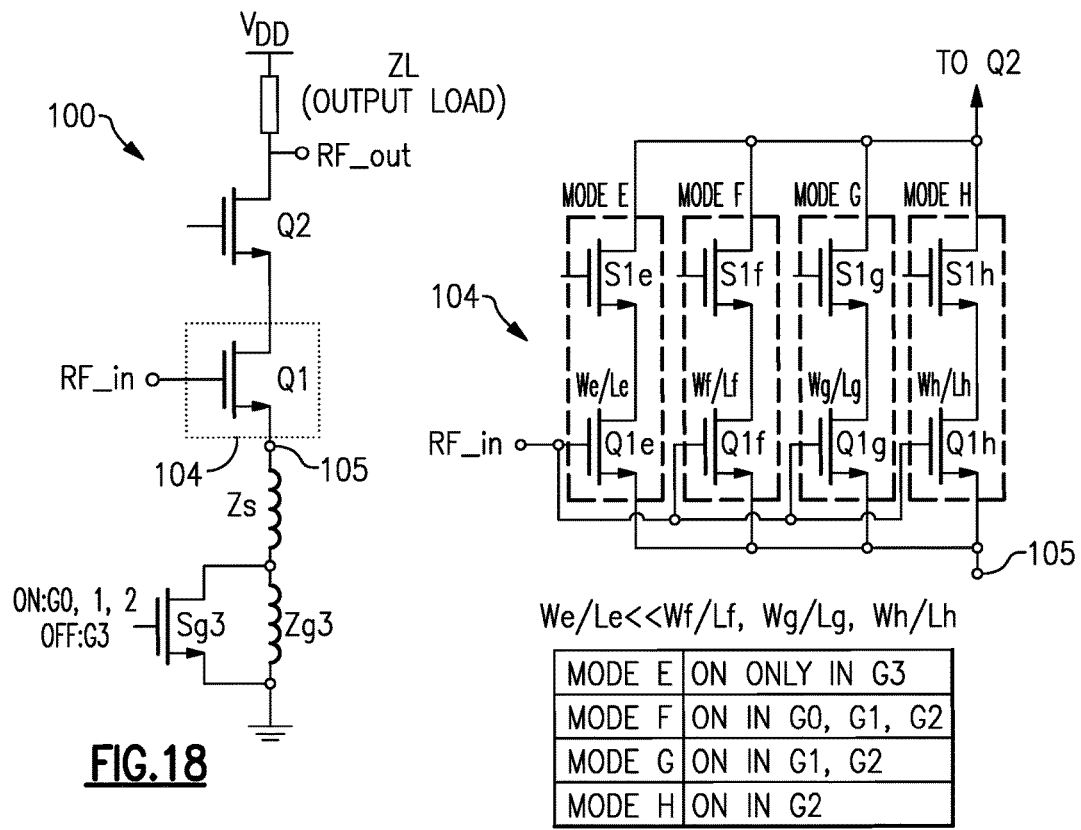
FIG.18
FIG.19
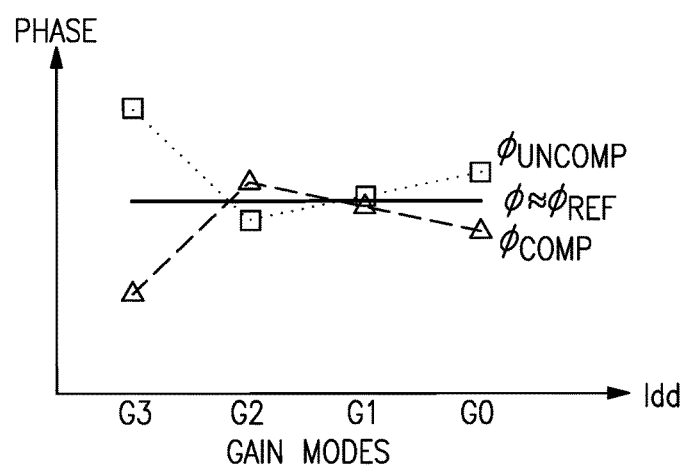
FIG.20

LOW-NOISE AMPLIFIER HAVING PROGRAMMABLE-PHASE GAIN STAGE

CROSS-REFERENCE TO RELATED APPLICATION(S)

This application claims priority to U.S. Provisional Application No. 62/381,353 filed Aug. 30, 2016, entitled LOW-NOISE AMPLIFIER HAVING PROGRAMMABLE-PHASE GAIN STAGE, the disclosure of which is hereby expressly incorporated by reference herein in its respective entirety.

BACKGROUND

Field

The present disclosure relates to radio-frequency amplifiers such as low-noise amplifiers.

Description of the Related Art

In radio-frequency (RF) applications, an amplifier is utilized to amplify a signal. For transmission, a signal is typically amplified by a power amplifier so that the amplified signal is transmitted through an antenna with a desired power. For reception, a relatively weak signal received through an antenna is typically amplified by a low-noise amplifier. The amplified signal with little or no noise added is then processed further by a receiver circuit.

SUMMARY

In accordance with some implementations, the present disclosure relates to a radio-frequency (RF) amplifier that includes an input node, an output node, and a programmable-phase gain stage implemented between the input node and the output node. The programmable-phase gain stage is configured to operate in one of a plurality of gain settings, and to provide a desired phase for an RF signal at each of the plurality of gain settings.

In some embodiments, the RF amplifier can be a low-noise amplifier (LNA). The LNA can be implemented in a cascode configuration having an input stage and a cascode stage, with the programmable-phase gain stage being implemented as at least the input stage.

In some embodiments, the desired phase at each of the plurality of gain settings can be selected to provide an approximately constant phase among the plurality of gain settings.

In some embodiments, the programmable-phase gain stage can include one or more transistors each having a gate for receiving the RF signal, a source coupled to a ground, and a drain for outputting an amplified RF signal, such that the transistor includes an effective input resistance, an effective input inductance L and an effective gate-source capacitance Cgs. The programmable-phase gain stage can include a plurality of transistors implemented in an electrically parallel configuration, with each transistor having a Cgs value such that different net Cgs values are obtained by operation of one or more of the transistors, and the different net Cgs values providing different phases.

In some embodiments, the programmable-phase gain stage can further include a switch implemented at the drain of each transistor to control the operation of the transistor. The Cgs value of the corresponding transistor can be obtained at least in part by W/L dimensions of the transistor.

In some embodiments, the plurality of transistors can be configured so that one transistor is operational in a lowest gain setting, and an additional transistor is operational for each increased gain setting. The W/L dimensions of at least one transistor can be dimensioned substantially differently from W/L dimensions of other transistors to provide phase compensation for a secondary effect resulting from a gain setting specific to the at least one transistor. The gain setting specific to the at least one transistor can be a lowest gain setting, and the corresponding transistor can have W/L dimensions that are substantially smaller than those of the other transistors.

In some embodiments, at least one transistor of the programmable-phase gain stage can be configured such that its effective input inductance L includes a variable inductance. The variable inductance can be configured to include a range of L values to obtain the desired phase for the RF signal at each of the plurality of gain settings.

In some embodiments, at least one transistor of the programmable-phase gain stage can be configured to include a variable capacitance between the gate and the source. The variable capacitance can be configured to provide a range of Cgs values to obtain the desired phase for the RF signal at each of the plurality of gain settings.

In some teachings, the present disclosure relates to a method for amplifying a radio-frequency (RF) signal. The method includes configuring a gain stage to be in a selected one of a plurality of gain settings, with at least some of the gain settings resulting in different phases for the RF signal. The method further includes adjusting the phase of the RF signal for the selected gain setting, with the adjusted phase being part of desired phases adjusted from the different phases.

In some embodiments, the gain stage can be part of a low-noise amplifier (LNA). In some embodiments, the desired phases can result in an approximately constant phase among the plurality of gain settings.

In some embodiments, the adjusting of the phase can include adjusting one or more of an effective input inductance L and an effective gate-source capacitance Cgs of a transistor of the gain stage having a gate for receiving the RF signal, a source coupled to a ground, and a drain for outputting an amplified RF signal. The adjusting of the phase can include operating a plurality of transistors in an electrically parallel configuration, with each transistor having a Cgs value such that different net Cgs values are obtained by operation of one or more of the transistors, and the different net Cgs values providing different phases. The operating of the plurality of transistors can include performing a switching operation at the drain of each transistor to control the operation of the transistor.

In some embodiments, the adjusting of the phase can include adjusting the effective input inductance L. The adjusting of the effective input inductance L can include adjusting a variable inductance.

In some embodiments, the adjusting of the phase can include adjusting the effective gate-source capacitance Cgs. The adjusting of the effective gate-source capacitance Cgs can include adjusting a variable capacitance implemented between the gate and source of the transistor.

In some implementations, the present disclosure can include a semiconductor die having a radio-frequency (RF) circuit. The semiconductor die includes a substrate, and an RF amplifier implemented on the substrate. The RF amplifier includes a programmable-phase gain stage configured to operate in one of a plurality of gain settings, and to provide a desired phase for an RF signal at each of the plurality of gain settings.

In some embodiments, the substrate can include a silicon-on-insulator (SOI) substrate. In some embodiments, the RF amplifier can be a low-noise amplifier (LNA).

According to some implementations, the present disclosure relates to a radio-frequency (RF) module that includes a packaging substrate configured to receive a plurality of components, and an RF amplifier implemented on the packaging substrate. The RF amplifier includes a programmable-phase gain stage configured to operate in one of a plurality of gain settings, and to provide a desired phase for an RF signal at each of the plurality of gain settings.

In some embodiments, the RF amplifier can be implemented on a semiconductor die that is mounted on the packaging substrate. The RF amplifier can be a low-noise amplifier (LNA). The RF module can be a diversity receive (DRx) module.

In a number of teachings, the present disclosure relates to a wireless device that includes an antenna configured to at least receive a radio-frequency (RF) signal, and an RF amplifier in communication with the antenna. The RF amplifier includes a programmable-phase gain stage configured to operate in one of a plurality of gain settings, and to provide a desired phase for the RF signal at each of the plurality of gain settings. The wireless device further includes a transceiver configured to process an amplified RF signal with the desired phase from RF amplifier.

In some embodiments, the wireless device can be a cellular phone configured to include different gains in receive operations.

According to some teachings, the present disclosure relates to a signal amplifier that includes a variable-gain stage configured to provide a plurality of gain levels that result in a different phase shift being introduced to a respective signal passing through the variable-gain stage. The variable-gain stage includes a plurality of switchable amplification branches each capable of being activated such that one or more of the activated amplification branches provides a selected compensating phase shift.

In some implementations, the present disclosure relates to a semiconductor die that includes a substrate, and a signal amplifier implemented on the substrate and having a variable-gain stage configured to provide a plurality of gain levels that result in a different phase shift being introduced to a respective signal passing through the variable-gain stage. The variable-gain stage includes a plurality of switchable amplification branches each capable of being activated such that one or more of the activated amplification branches provides a selected compensating phase shift.

In some implementations, the present disclosure relates to a radio-frequency module that includes a packaging substrate configured to receive a plurality of components, and a signal amplifier implemented on the packaging substrate. The signal amplifier includes a variable-gain stage configured to provide a plurality of gain levels that result in a different phase shift being introduced to a respective signal passing through the variable-gain stage. The variable-gain stage includes a plurality of switchable amplification branches each capable of being activated such that one or more of the activated amplification branches provides a selected compensating phase shift.

According to some teachings, the present disclosure relates to a wireless device that includes an antenna, and a signal amplifier in communication with the antenna. The signal amplifier includes a variable-gain stage configured to provide a plurality of gain levels that result in a different phase shift being introduced to a respective signal passing through the variable-gain stage. The variable-gain stage includes a plurality of switchable amplification branches each capable of being activated such that one or more of the activated amplification branches provides a selected compensating phase shift. The wireless device further includes a transceiver configured to process an amplified signal from the signal amplifier.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 7 shows that in some embodiments, an LNA can include a phase compensation circuit implemented by providing a plurality of RF stage transistors and routing an RF signal through one or more of such RF stage transistors in selective manners.

FIG. 8 shows an example of the phase compensation circuit of FIG. 7, where four RF stage transistors can be implemented in a parallel manner to allow processing of an input RF signal through one or more of the RF stage transistors.

FIG. 9 shows capacitance Cgs plots as a function of different gain modes.

FIG. 10 shows an example of how phase compensation can be achieved by compensating the capacitance Cgs.

FIG. 18 shows an LNA having a switchable inductance similar to the example of FIG. 16.

FIG. 19 shows an example of how the phase compensation circuit of FIG. 18 can be implemented.

FIG. 20 shows an example of how phase compensation can be achieved for the LNA of FIGS. 18 and 19.

DETAILED DESCRIPTION OF SOME EMBODIMENTS

The headings provided herein, if any, are for convenience only and do not necessarily affect the scope or meaning of the claimed invention.

Figure 1:
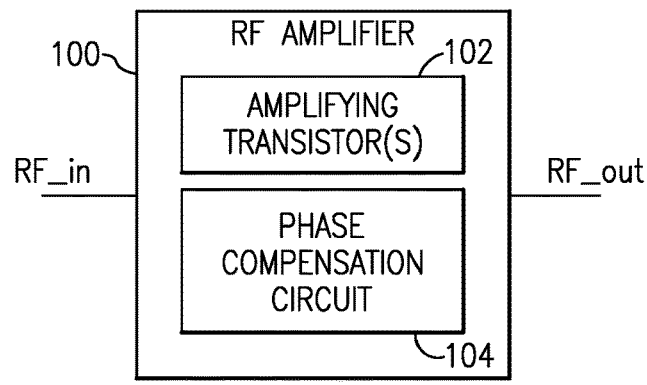
FIG. 1 depicts a radio-frequency (RF) amplifier having one or more amplifying transistors and a phase compensation circuit.

Described herein are architectures, circuits, devices and methods related to, among others, radio-frequency (RF) amplifiers having phase compensation functionality for various gain modes. FIG. 1 depicts an RF amplifier 100 having one or more amplifying transistors 102 and a phase compensation circuit 104. Such an RF amplifier can receive an input RF signal (RF_in) and amplify such a signal to generate an output RF signal (RF_out). For the purpose of description, various examples related to such an RF amplifier are described in the context of a low-noise amplifier (LNA). However, it will be understood that one or more features of the present disclosure can also be implemented for other types of RF amplifiers, including power amplifiers (PAs).

In many LNA applications, minimum or reduced phase variation over different gain modes is desirable. Such a performance feature allows good signal qualities to be provided in, for example, receive demodulation over different LNA gain modes, especially in higher order modulation systems. In some embodiments, an LNA circuit having one or more features as described herein can be configured to maintain a constant or approximately constant phase over different gain modes. Such a desirable feature can be achieved with little or no demodulation performance degradation (e.g., resulting from phase variation over gain modes in a high order receive system), without a baseband phase calibration that typically requires memory and calibration, and/or without a complicated L/C type on-chip calibration.

Figure 2A:
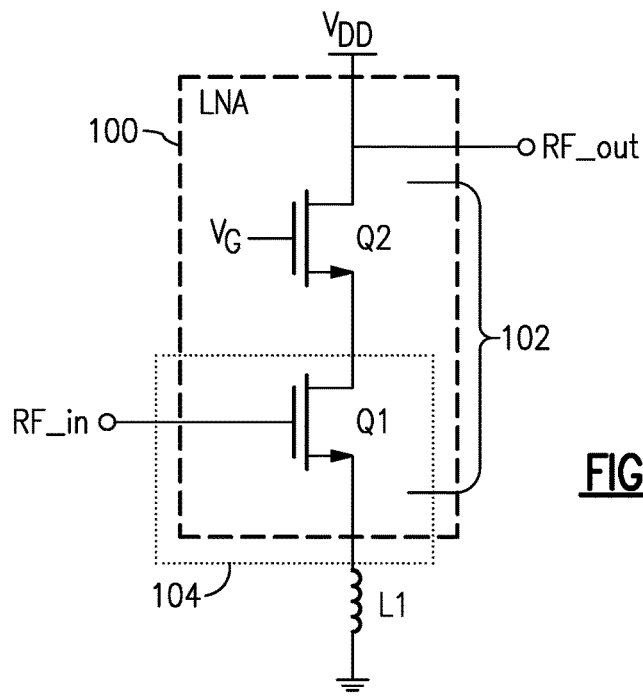
FIG. 2A shows that a low-noise amplifier (LNA) having one or more features as described herein can include first and second transistors implemented in a cascode configuration.

FIG. 2A shows that an LNA 100 having one or more features as described herein can include first and second transistors (collectively indicated as 102) implemented in a cascode configuration. For example, the first transistor Q1 can be configured to operate as a common source device (also referred to as an RF stage), and the second transistor Q2 can be configured to operate as a common gate device (also referred to as a cascode stage). More particularly, an input RF signal (RF_in) is shown to be provided to a gate of the first transistor Q1, and the amplified signal is shown to be output through its drain. The source of the first transistor Q1 is shown to be coupled to ground, typically through an inductance indicated as L1. The amplified signal from the drain of the first transistor Q1 is shown to be provided to a source of the second transistor Q2 for further amplification, and such further amplified signal is shown to be output through the drain of the second transistor Q2. The gate of the second transistor Q2 can be provided with an appropriate gate voltage $V_G$ for operation. In the example of FIG. 2, the LNA 100 is shown to be provided with a supply voltage $V_{DD}$ at the drain of Q2.

FIG. 2A further shows that in some embodiments, the LNA 100 can include or be provided with a phase compensation circuit 104. Various examples of such a phase compensation circuit are described herein in greater detail.

In the example of FIG. 2A, the phase compensation circuit 104 is shown to be associated with the first transistor Q1 (RF stage). However, it will be understood that such a phase compensation circuit can be provided for either or both of the first and second transistors Q1 (RF stage), Q2 (cascode stage).

Figure 2B:
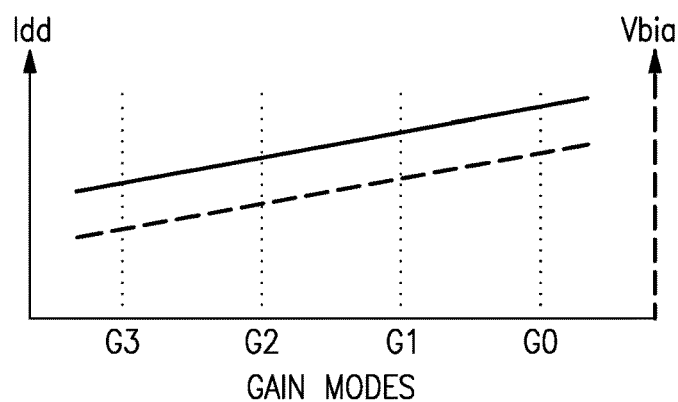
FIG. 2B shows an example of how the LNA of FIG. 2A can operate to provide a plurality of different gains.

FIG. 2B shows an example of how the LNA 100 of FIG. 2A can operate to provide a plurality of different gains. Suppose that there are four gain modes G0, G1, G2, G3 that can be provided by the LNA 100. In some embodiments, such different gain modes can be achieved by providing different bias voltage (Vbias) levels to the gate of Q1. Such different Vbias levels can result in, or be associated with, different levels of supply current Idd that can provide different gain levels.

In the example of FIG. 2B, an increase in Vbias is shown to result in an increase in Idd. Thus, the example gain modes G0, G1, G2, G3 are shown to be achieved at the corresponding levels of Idd.

For the purpose of description, it will be understood that FIGS. 2A and 2B may be referred to individually, collectively together as FIG. 2, or any combination thereof. It will also be understood that an LNA having one or more features as described herein can also have different numbers of gain levels.

Figure 3:
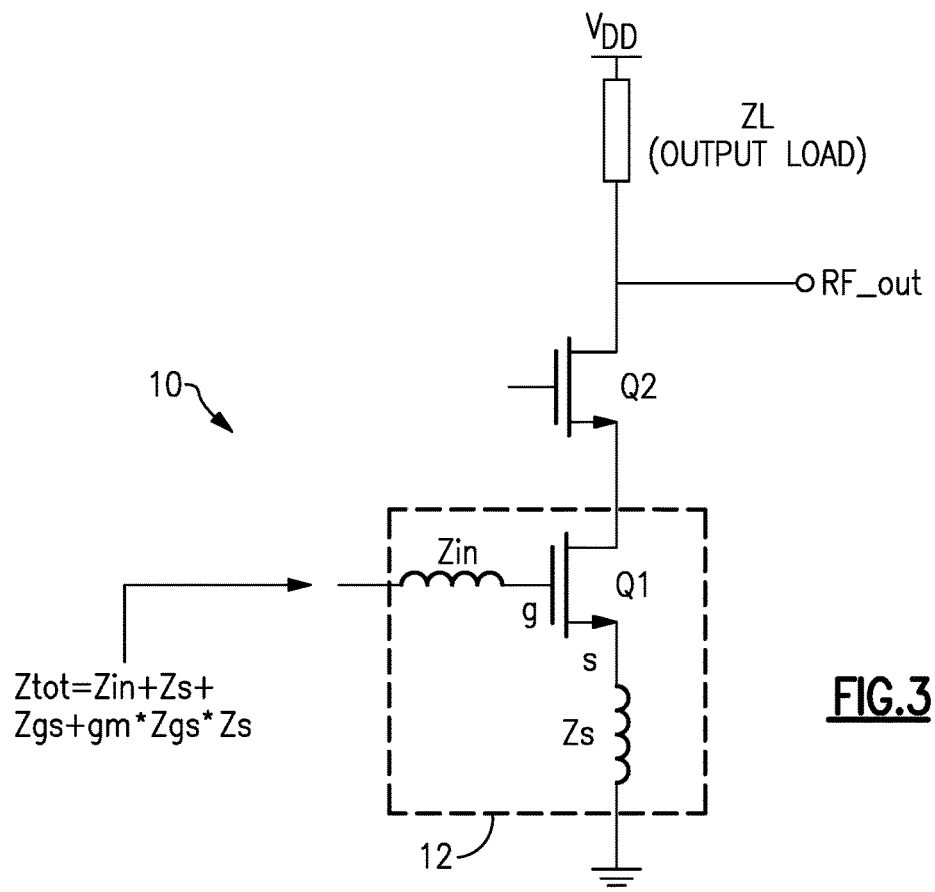
FIG. 3 shows a typical LNA configured as a cascode amplifier, but without a phase compensation circuit.

FIG. 3 shows a typical LNA 10 configured as a cascode amplifier, but without a phase compensation circuit. The RF stage 12 is depicted with impedances associated with various portions of the transistor Q1. For example, an input path to the gate of Q1 can have an effective inductance that results in an input impedance Zin presented to an input RF signal. Similarly, the grounding path of the source of Q1 can have an effective inductance that results in a source impedance Zs. One or more other impedances can arise from Q1, including, for example, a gate-to-source impedance Zgs and a transconductance related impedance gm*Zgs*Zs. Thus, with such example impedances, a total impedance Ztot presented to the input RF signal can be expressed as Ztot=Zin+Zs+Zgs+gm*Zgs*Zs.

Figure 4:
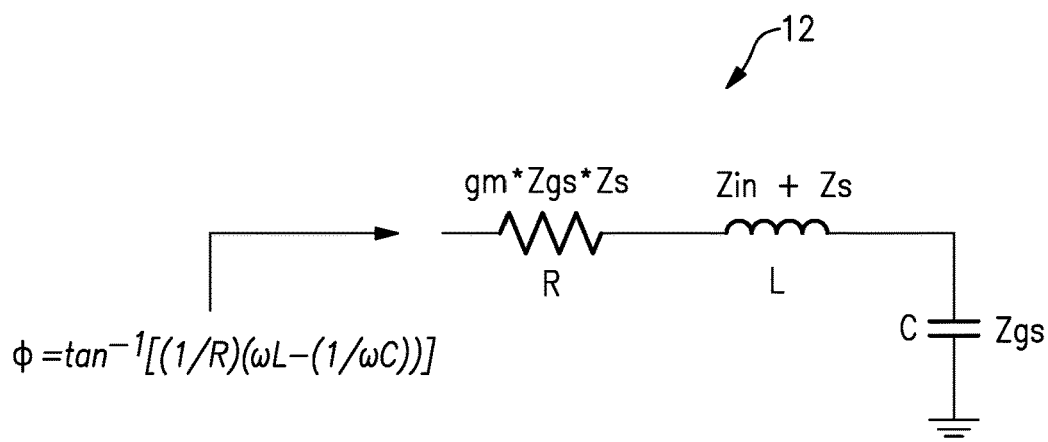
FIG. 4 shows an example of how the RF stage of the LNA of FIG. 3 can be represented as an RLC circuit.

FIG. 4 shows an example of how the RF stage 12 of FIG. 3 can be represented as an RLC circuit 12. Such a circuit can include a resistance R having one end at the input and the other end connected to one end of an inductance L. The other end of the inductance L can be coupled to ground through a capacitance C. The resistance R can be associated with the transconductance term gm*Zgs*Zs, the inductance L can be associated with a sum of Zin and Zs, and the capacitance C can be associated with Zgs. In such a representation, a phase change experienced by an RF signal having a frequency ω=2πf can be expressed as $$\phi = \tan^{-1}\left[\frac{1}{R}\left(\omega L - \frac{1}{\omega C}\right)\right], \quad (1)$$

and the resonance frequency can be expressed as $$\omega_o = \frac{1}{\sqrt{LC}}. \quad (2)$$

For the purpose of description, a phase change experienced by an RF signal may also be referred to as a phase shift or simply a phase.

Figure 5:
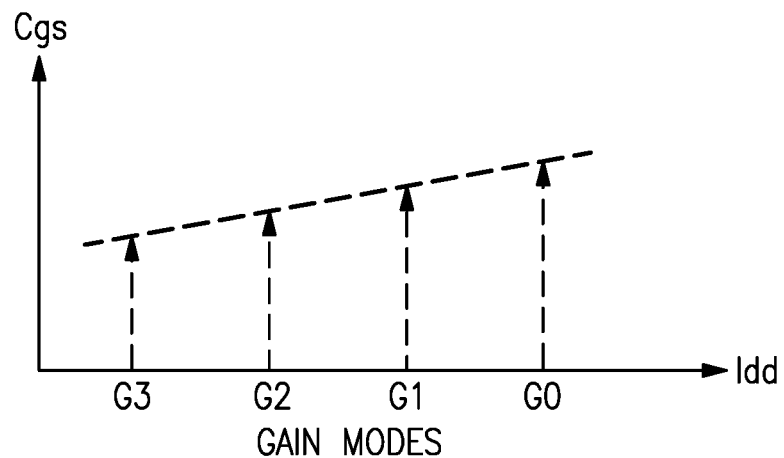
FIG. 5 shows that capacitance Cgs of FIGS. 3 and 4 can vary as a function of supply current Idd.

In the example of FIGS. 3 and 4, the LNA 10 can be operated at different gain modes by adjusting the supply current Idd. With such change in Idd, an electrical parameter such as Cgs can also change. For example, FIG. 5 shows that Cgs of FIGS. 3 and 4 can vary as a function of Idd. Thus, at a first Idd setting for an example gain mode G3, Cgs can have a first value. Similarly, a second Idd setting for a gain mode G2 can result in Cgs having a second value that is greater than the first Cgs value. Continuing such a trend, third and fourth settings for gain modes G1 and G0 can result in Cgs having third and fourth values having successively greater values. Thus, in FIG. 5, the dashed line depicts an example relationship between Cgs and Idd.

Figure 6:
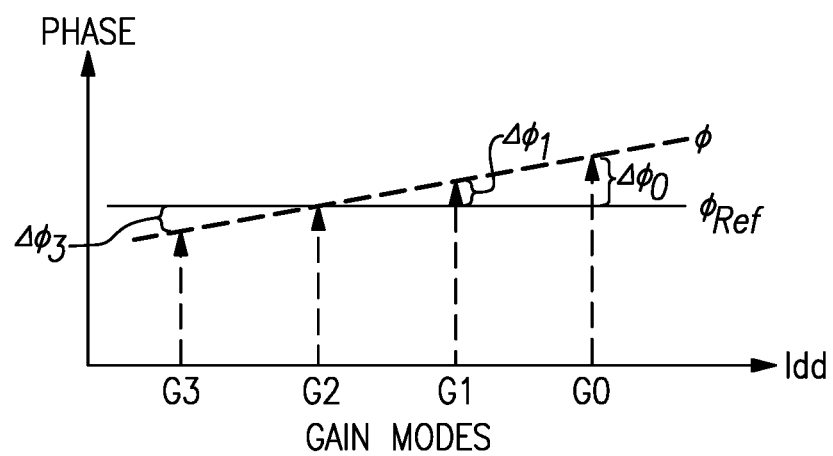
FIG. 6 shows an example of how phase can vary due to the variation of the capacitance Cgs.

In the example of FIGS. 3 and 4, the foregoing variation in Cgs can result in a corresponding variation in phase (also referred to herein as phase change) as a function of Idd. Such a variation in phase is depicted in FIG. 6. As shown, different gain modes of the LNA result in different phases due to the capacitance Cgs. Thus, when the LNA is in the G3 gain mode, the phase due to Cgs differs from a reference phase $\Phi_{Ref}$ by an amount $\Delta\Phi_3$. Similarly, when the LNA is in the G1 and G0 modes, the respective phases due to Cgs differ from the reference phase $\Phi_{Ref}$ by amounts $\Delta\Phi_1$ and $\Delta\Phi_0$. In the example of FIG. 6, the gain mode G2 is shown to result in the phase $\Phi$ being close to the reference phase $\Phi_{Ref}$, thus, its difference relative to the reference phase $\Phi_{Ref}$ is not shown.

FIGS. 3-6 generally relate to a variation in phase due to a single effect such as an effect of Cgs. It will be understood that such a single effect can be based on other electrical parameters associated with the LNA of FIGS. 3 and 4. It will also be understood that for the purpose of description, such a single effect can result from a combination of a plurality of electrical parameters, if such parameters collectively contribute to some relatively smooth function over all of the gain modes.

FIGS. 7-14 show various examples of how a phase compensation circuit 104 can be implemented for an LNA 100 to compensate for single-effect variations in phase, such as those of FIGS. 3-6. FIG. 7 shows that in some embodiments, an LNA 100 can include a phase compensation circuit 104 implemented by providing a plurality of RF stage transistors and routing an RF signal through one or more of such RF stage transistors in selective manners.

FIG. 8 shows an example of such a phase compensation circuit (104) having four example RF stage transistors Q1a, Q1b, Q1c, Q1d implemented in a parallel manner to allow processing of an input RF signal through one or more of the RF stage transistors Q1a, Q1b, Q1c, Q1d. More particularly, the input node RF_in is shown to be coupled to each gate of the four RF stage transistors Q1a, Q1b, Q1c, Q1d, and the drain of each RF stage transistor is shown to be routed to a cascode stage transistor Q2 (not shown in FIG. 8) through a respective switch transistor. For example, the drain of Q1a can be routed to Q2 through a first switch transistor S1a, the drain of Q1b can be routed to Q2 through a second switch transistor S1b, and so on. The sources of the four RF stage transistors Q1a, Q1b, Q1c, Q1d are shown to be coupled to ground through an inductance L1. Configured in the foregoing example manner, an RF signal can be processed through one or more parallel RF stage transistors.

As described herein, a given RF stage transistor has an effective capacitance Cgs. It is noted that such a capacitance Cgs can depend on one or more dimensions (indicated as W/L in FIG. 8) of that RF stage transistor. Thus, in the example of FIG. 8, the dimensions Wa/La, Wb/Lb, Wc/Lc, Wd/Ld corresponding to the RF stage transistors Q1a, Q1b, Q1c, Q1d can be selected to provide different net values of Cgs when combined in different combinations (e.g., parallel combinations). For example, if Q1a is utilized alone (e.g., by turning S1a ON and turning the remaining switch transistors OFF), the net Cgs value can be approximately that of the Cgs of Q1a. In another example, if Q1a and Q1b are utilized (e.g., by turning S1a and S1b ON and turning S1c and S1d OFF), the net Cgs value can be approximately a sum of the Cgs values of Q1a and Q1b. It will be understood that such dimensions Wa/La, Wb/Lb, Wc/Lc, Wd/Ld can be all substantially the same, all different, or any combination thereof.

Configured in the foregoing manner, different net Cgs values can be obtained for different gain modes. For example, the four gain modes G0, G1, G2, G4 can include combinations of the RF stage transistors Q1a, Q1b, Q1c, Q1d as listed in Table 1.

TABLE 1

| Gain mode | Enabled RF stage transistor(s) | Net Cgs |
|---|---|---|
| G0 | Q1a | $(Cgs)_a$ |
| G1 | Q1a, Q1b | $(Cgs)_a + (Cgs)_b$ |
| G2 | Q1a, Q1b, Q1c | $(Cgs)_a + (Cgs)_b + (Cgs)_c$ |
| G3 | Q1a, Q1b, Q1c, Q1d | $(Cgs)_a + (Cgs)_b + (Cgs)_c + (Cgs)_d$ |

As described herein, dimensions of the RF stage transistors Q1a, Q1b, Q1c, Q1d can be selected to provide respective Cgs values $(Cgs)_a$, $(Cgs)_b$, $(Cgs)_c$, $(Cgs)_d$. As shown in Table 1, such Cgs values can be combined to provide different desired net Cgs values for the phase compensation circuit 104 of FIG. 8.

For example, FIG. 9 shows Cgs plots as a function of different gain modes (e.g., that depend on Idd). Suppose that the dashed line represents a Cgs characteristics for an uncompensated LNA (e.g., as in the example of FIGS. 3-6), where Cgs increases proportionally with Idd. To provide compensation for such an LNA, the example configuration of FIGS. 7 and 8 and Table 1 can be implemented, where the net Cgs at the gain mode G3 (lower Idd) is greater than the net Cgs of G2 which is in turn greater than the net Cgs of G1, etc. Such net Cgs values for compensation are depicted as a solid line (Cgs(Comp)). Such net Cgs values can be selected to compensate for the Cgs variation in the uncompensated case. For example, a net Cgs value at a given gain mode can include a Cgs contribution from the selected dimension of the corresponding RF stage transistor to compensate for Cgs variation resulting from one or more other effects associated with the RF stage transistor. In some embodiments, such compensation can result in, for example, a Cgs profile that is substantially uniform for the different gain modes.

As described herein in reference to FIGS. 5 and 6, variation in phase can result from variation in capacitance (such as Cgs) associated with an LNA. Thus, the compensating Cgs profile of the example of FIG. 9 can result in a compensating phase profile depicted in FIG. 10 as $\Phi_{Comp}$. Similar to the compensating Cgs providing a desirable uniform net Cgs profile, such $\Phi_{Comp}$ can provide compensation for the uncompensated phase effect ($\Phi_{Uncomp}$) to result in a phase profile $\Phi$ that is, for example, substantially uniform at a reference value $\Phi_{Ref}$.

In the examples of FIGS. 9 and 10, the compensating Cgs profile and the compensating phase profile are described as generally canceling some uncompensated effects. It will be understood that such uncompensated effects may or may not be known. By utilizing one or more features of the present disclosure, an operating parameter such as phase at an LNA can be configured into any profile (including a substantially flat profile) with or without knowledge of such uncompensated effects.

In the examples of FIGS. 7-10, phase compensation is described as being achieved by controlling the net Cgs value of an assembly of RF stage transistors. Such controlling of capacitance (such as Cgs) is an example of how one or more capacitances and/or one or more inductances associated with an LNA (e.g., an RF stage portion of the LNA) can be controlled to desirably control how much phase change occurs at the LNA.

Figure 11:
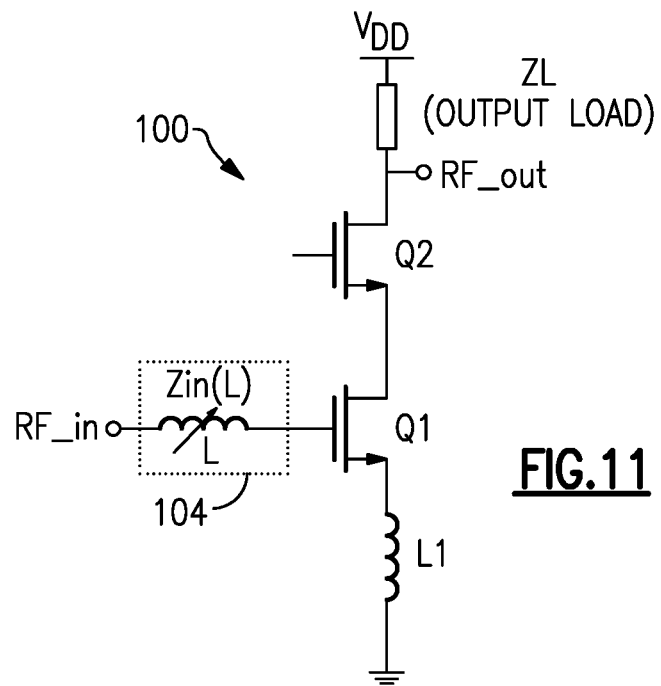
FIG. 11 shows an example where an inductance associated with an LNA can be controlled to provide a desirable phase profile at the LNA.

FIG. 11 shows an example where an inductance associated with an LNA can be controlled to provide a desirable phase profile at the LNA. As described herein, an inductance at an input of the LNA can affect how much phase change occurs at the LNA. For example, the LNA 10 in FIG. 3 includes an input inductance that contributes to an overall impedance of the LNA as well as an overall phase change at the LNA.

In FIG. 11, an LNA 100 is shown to have a cascode configuration similar to the example of FIG. 3. However, the LNA 100 of FIG. 11 is shown to include a phase compensation circuit 104 implemented to provide a variable inductance L at an input of the LNA 100. Such a variable inductance can provide a variable input impedance Zin as shown. Such a variable inductance can also be utilized to control how much phase shift occurs at the LNA, similar to the examples of FIGS. 7-10.

Figure 12:
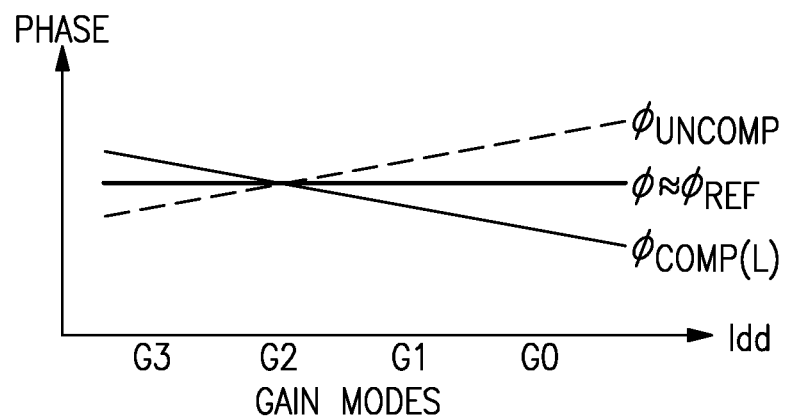
FIG. 12 shows an example of how phase compensation can be achieved by adjusting the inductance associated with the LNA.

Thus, and as depicted in FIG. 12, the variable input inductance L of the example of FIG. 11 can be operated to provide a compensating phase profile depicted as $\Phi_{Comp}(L)$. Similar to the example of FIG. 10, such $\Phi_{Comp}(L)$ can provide compensation for the uncompensated phase effect ($\Phi_{Uncomp}$) to result in a phase profile $\Phi$ that is, for example, substantially uniform at a reference value $\Phi_{Ref}$.

Figure 13:
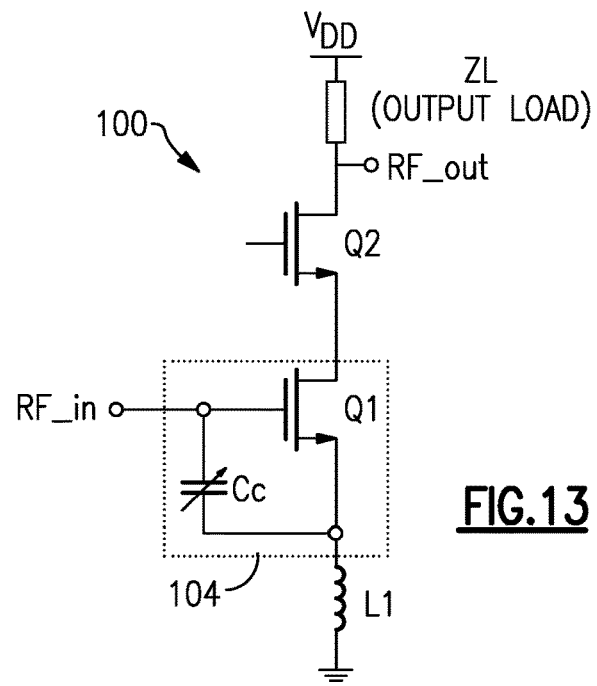
FIG. 13 shows that a capacitance associated with an LNA can also be varied to allow compensation of capacitance of the LNA, and therefore compensation of phase at the LNA.

In the examples of FIGS. 7-10, a capacitance such as Cgs can be varied by selective operation of a plurality of appropriately dimensioned RF stage transistors. FIG. 13 shows that a capacitance associated with an LNA can also be varied in other manner to provide compensation of capacitance of the LNA, and therefore compensation of phase at the LNA.

In FIG. 13, an LNA 100 can have a cascode configuration similar to the example of FIG. 3. In some embodiments, the RF stage transistor Q1 of such an LNA can include a single transistor or a plurality of transistors similar to the example of FIG. 7. In the example of FIG. 13, the LNA 100 can include a phase compensation circuit 104 implemented to include a variable capacitance Cc having one end coupled to the gate of Q1 and the other end coupled to the source of Q1. Thus, the variable capacitance Cc can be electrically parallel with the Cgs (non-adjustable or adjustable) associated with Q1. Accordingly, the net Cgs value associated with Q1 can be a sum of Cgs and Cc, and such a net Cgs value can be adjusted by the variable capacitance Cc.

Figure 14:
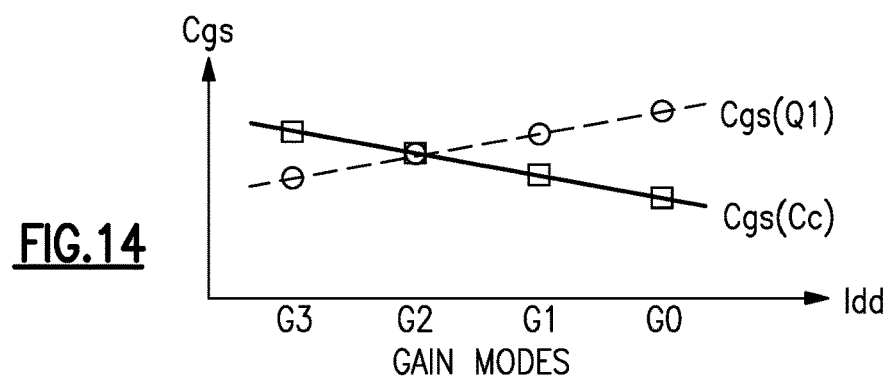
FIG. 14 shows an example of how the variation of the capacitance associated with the LNA can compensate the variation of capacitance Cgs at different gain modes.

Accordingly, and assuming that Cgs of Q1 (Cgs(Q1)) is non-adjustable similar to the example of FIG. 3, FIG. 14 shows that such a capacitance (Cgs) can suffer from having different values at different gain modes (depicted as a dashed line). Such a variation in Cgs(Q1) can be compensated by adjusting the variable capacitance Cc (depicted as a solid line Cgs(Cc)) to result in a net Cgs capacitance that is, for example, substantially flat over the different gain modes.

Figure 15:
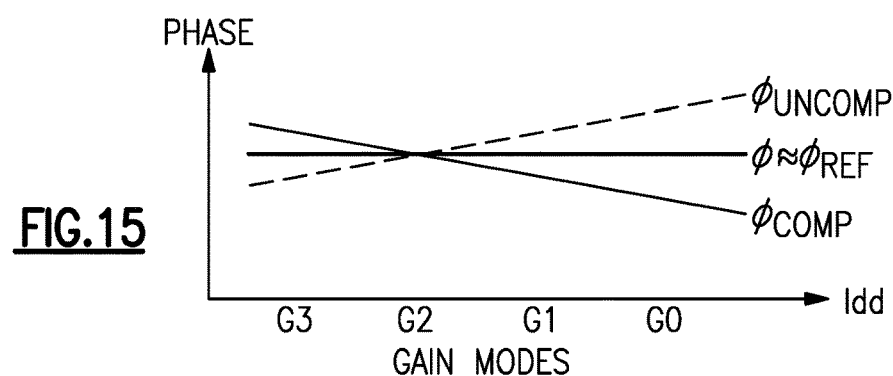
FIG. 15 shows an example of how phase compensation can be achieved by adjusting the capacitance associated with the LNA.

FIG. 15 shows an example of how phase compensation can be achieved for the LNA of FIG. 14. In FIG. 15, the variable capacitance Cc of the example of FIG. 14 can be operated to result in a compensating phase profile depicted as $\Phi_{Comp}$. Similar to the example of FIG. 10, such $\Phi_{Comp}$ can provide compensation for the uncompensated phase effect ($\Phi_{Uncomp}$) to result in a phase profile $\Phi$ that is, for example, substantially uniform at a reference value $\Phi_{Ref}$.

As described herein, FIGS. 3-6 generally relate to a variation in phase due to a single effect such as an effect of Cgs. FIGS. 7-15 generally relate to how phase compensation can be achieved to address such a variation in phase utilizing different techniques.

Figure 16:
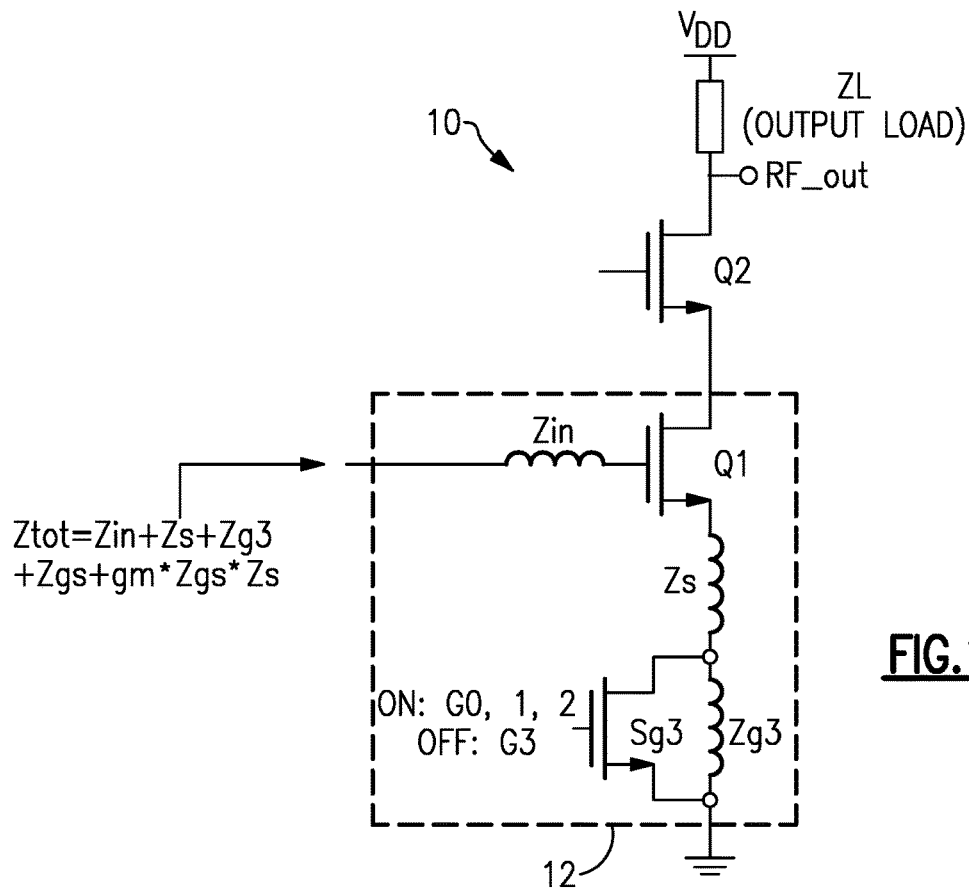
FIG. 16 shows an LNA having a cascode configuration similar to the example of FIG. 3, but with an additional switchable inductance path included between the source inductance and the ground.

In some embodiments, an LNA may be configured such that phase associated with the LNA is affected by a single effect (such as an effect of Cgs), as well as a gain mode specific effect. For example, FIG. 16 shows an LNA 10 having a cascode configuration similar to the example of FIG. 3. However, in the example of FIG. 16, an additional switchable inductance path (indicated as Zg3) is shown to be included between the source inductance (indicated as Zs) and the ground. A switch (Sg3) is shown to be provided to be electrically parallel with such an inductance (Zg3). Thus, when the switch Sg3 is OFF, the total inductance between the source of Q1 and the ground is approximately Zs+Zg3. When the switch Sg3 is ON, Zg3 is bypassed, and the total inductance between the source of Q1 and the ground is approximately Zs.

In some embodiments, such a switchable inductance (Zg3/Sg3) can be provided to address a gain mode specific concern in an LNA design. For example, and as shown in FIG. 16, Zgs can be switched in (by turning Sg3 OFF) when the LNA is in the gain mode G3 so as to meet a higher third order input intercept point (IIP3), and be switched out (by turning Sg3 ON) in other gain modes. Thus, in such a configuration, the total inductance between the source of Q1 and the ground is approximately Zs+Zg3 when in the gain mode G3, and Zs when in the other gain modes (G2, G1, G0). Accordingly, a total impedance Ztot presented to an input RF signal at the LNA 10 can be expressed as Ztot=Zin+Zs+Zg3+Zgs+gm*Zgs*Zs when in the gain mode G3, and Ztot=Zin+Zs+Zgs+gm*Zgs*Zs when in the gain modes G2, G1, G0.

Figure 17:
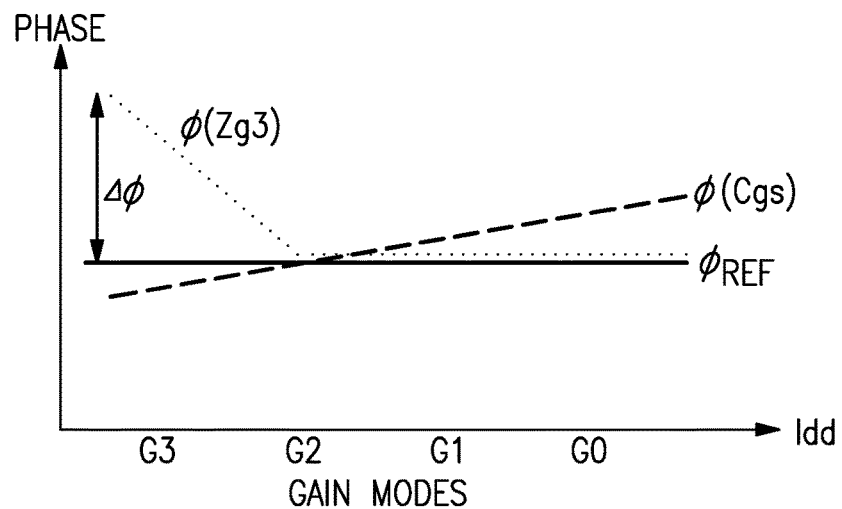
FIG. 17 shows an example of how gain mode specific effect can impact how phase differs among the various gain modes.

FIG. 17 shows how the foregoing gain mode specific effect (e.g., Zg3 present in G3 and absent in other modes) can impact how phase can differ among the various gain modes. The dotted line indicated as Φ(Zg3) depicts mode-specific impact on phase, and such a phase profile is shown to have a significantly different phase (e.g., by an amount ΔΦ) when in the gain mode G3, and generally uniform when in the other gain modes.

In FIG. 17, the dashed line indicated as Φ(Cgs) depicts a variation in phase over all of the gain modes resulting from a single effect (e.g., due to Cgs), similar to the example of FIGS. 5 and 6. Accordingly, a net variation in phase ($\Phi_{Uncomp}$) results from a combination of Φ(Cgs) and Φ(Zg3) (e.g., $\Phi_{Uncomp}=\Phi(Cgs)+\Phi(Zg3)$). Examples related to such an uncompensated phase profile are shown in FIGS. 20, 22 and 24, along with examples of corresponding phase compensation techniques.

Figure 21:
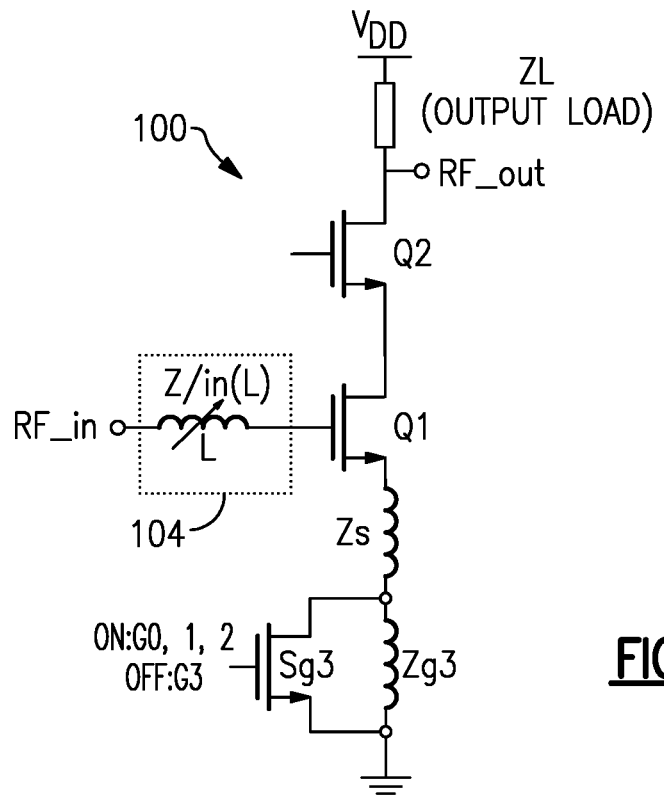
FIG. 21 shows an LNA having a switchable inductance similar to the example of FIG. 16, and a phase compensation circuit that is similar to the example of FIG. 11.
Figure 22:
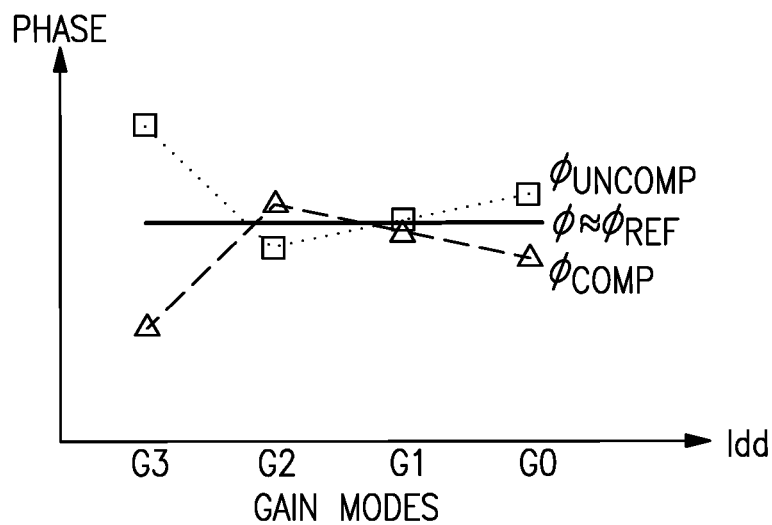
FIG. 22 shows an example of how phase compensation can be achieved for the LNA of FIG. 21.
Figure 23:
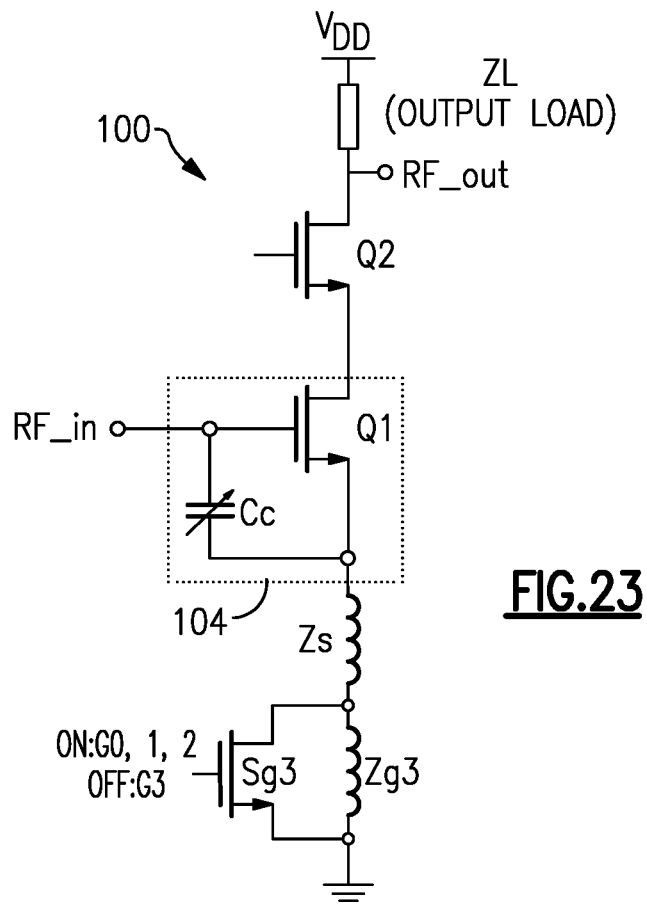
FIG. 23 shows an LNA having a switchable inductance similar to the example of FIG. 16, and a phase compensation circuit that is similar to the example of FIG. 13.
Figure 24:
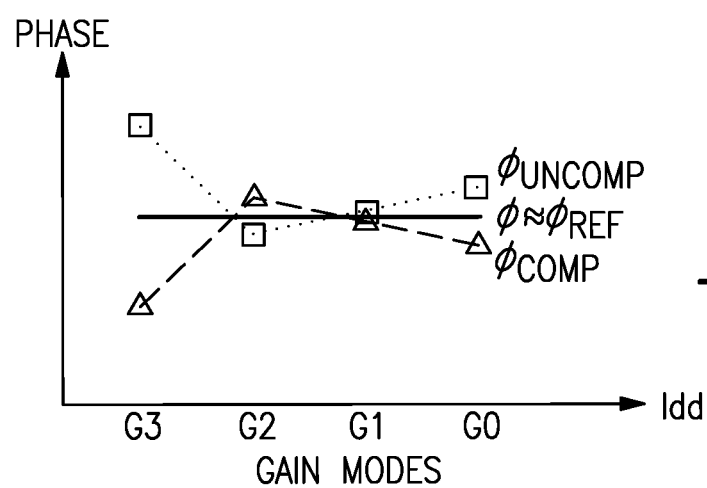
FIG. 24 shows an example of how phase compensation can be achieved for the LNA of FIG. 23.

FIGS. 18-24 show examples of how phase compensation can be implemented to address a situation of FIGS. 16 and 17, in which a gain mode specific phase effect is present. Such phase compensation techniques are based on the three example techniques of FIGS. 7-15. More particularly, FIGS. 18-20 show a phase compensation technique similar to the example technique of FIGS. 7-10; FIGS. 21 and 22 show a phase compensation technique similar to the example technique of FIGS. 11 and 12; and FIGS. 23 and 24 show a phase compensation technique similar to the example technique of FIGS. 13-14. It will be understood that other phase compensation techniques can also be implemented.

FIG. 18 shows an LNA 100 having a switchable Zg3 similar to the example of FIG. 16. However, the LNA 100 of FIG. 18 includes a phase compensation circuit 104 that can be similar to the example of FIG. 7. In some embodiments, such a compensation circuit (104 in FIG. 18) can be configured and operated to address the gain mode specific phase variation, as well as the phase variation affecting all of the gain modes. In the example of FIG. 18, the source of Q1 is shown to be a node 105 on one side of the inductance contributing to an impedance Zs. In the example of FIG. 18, the other side of the inductance (Zs) is shown to be coupled to ground through a parallel combination of a Zg3 inductance and a Sg3 switch, similar to the example of FIG. 16.

FIG. 19 shows an example of how the phase compensation circuit 104 of FIG. 18 can be implemented. In FIG. 19, a phase compensation circuit 104 can have an architecture that is similar to the example of FIG. 8.

In the example of FIG. 19, the phase compensation circuit 104 is shown to include four example RF stage transistors Q1e, Q1f, Q1g, Q1h implemented in a parallel manner to allow processing of an input RF signal through one or more of the RF stage transistors Q1e, Q1f, Q1g, Q1h. More particularly, the input node RF_in is shown to be coupled to each gate of the four RF stage transistors Q1e, Q1f, Q1g, Q1h, and the drain of each RF stage transistor is shown to be routed to a cascode stage transistor Q2 (not shown in FIG. 19) through a respective switch transistor. For example, the drain of Q1e can be routed to Q2 through a first switch transistor S1e, the drain of Q1f can be routed to Q2 through a second switch transistor S1f, and so on. The sources of the four RF stage transistors Q1a, Q1b, Q1c, Q1d are shown to form common node 105. Configured in the foregoing example manner, an RF signal can be processed through one or more parallel RF stage transistors.

As described herein, a given RF stage transistor has an effective capacitance Cgs. It is noted that such a capacitance Cgs can depend on one or more dimensions (indicated as W/L in FIG. 19) of that RF stage transistor. Thus, in the example of FIG. 19, the dimensions We/Le, Wf/Lf, Wg/Lg, Wh/Lh corresponding to the RF stage transistors Q1e, Q1f, Q1g, Q1h can be selected to provide different net values of Cgs when combined in different combinations (e.g., parallel combinations). For example, if Q1e is utilized alone (e.g., by turning S1e ON and turning the remaining switch transistors OFF), the net Cgs value can be approximately that of the Cgs of Q1e. In another example, if Q1e and Q1f are utilized (e.g., by turning S1e and S1f ON and turning S1g and S1h OFF), the net Cgs value can be approximately a sum of the Cgs values of Q1e and Q1f.

In some embodiments, one or more dimensions (We/Le) associated with Q1e can be significantly smaller than those of the other RF stage transistors (Q1f, Q1g, Q1h). Such a significantly smaller Q1e can be utilized to address the gain mode specific effect as described herein.

For example, as shown in FIG. 19 and listed in Table 2, the four gain modes G0, G1, G2, G4 can include different combinations of the RF stage transistors Q1e, Q1f, Q1g, Q1h.

TABLE 2

| Gain mode | Enabled RF stage transistor(s) | Net Cgs |
|---|---|---|
| G0 | Q1f | $(Cgs)_f$ |
| G1 | Q1f, Q1g | $(Cgs)_f + (Cgs)_g$ |
| G2 | Q1f, Q1g, Q1h | $(Cgs)_f + (Cgs)_g + (Cgs)_h$ |
| G3 | Q1e | $(Cgs)_e$ |

In the example of FIG. 19 and Table 2, the Cgs values associated with Q1f, Q1g, Q1h can be selected to provide a single-effect phase compensation similar to the example of FIGS. 8-10. The Cgs value associated with Q1e, however, can be selected to provide phase compensation to address the combination of the single-effect and the gain mode specific effect of G3.

When implemented in the foregoing manner, the phase compensation circuit 104 of FIGS. 18 and 19 can result in a compensating phase profile depicted in FIG. 20 as $\Phi_{Comp}$, and such a profile can provide compensation for the uncompensated phase ($\Phi_{Uncomp}$ which includes the single-effect and the gain mode specific effect at G3) to result in a phase profile Φ that is, for example, substantially uniform at a reference value $\Phi_{Ref}$.

FIG. 21 shows an LNA 100 having a switchable Zg3 similar to the example of FIG. 16. However, the LNA 100 of FIG. 21 includes a phase compensation circuit 104 that can be similar to the example of FIG. 11. In some embodiments, such a compensation circuit (104 in FIG. 21) can be configured and operated to address the gain mode specific phase variation, as well as the phase variation affecting all of the gain modes.

In the example of FIG. 21, an inductance associated with the LNA can be controlled to provide a desirable phase profile at the LNA. As described herein, an inductance at an input of the LNA can affect how much phase occurs at the LNA. For example, the LNA 10 in FIG. 3 includes an input inductance that contributes to an overall impedance of the LNA as well as an overall phase at the LNA.

In FIG. 21, the phase compensation circuit 104 can be implemented to provide a variable inductance L at an input of the LNA 100. Such a variable inductance can provide a variable input impedance Zin as shown. Such a variable inductance can also be utilized to control how much phase shift occurs at the LNA.

More particularly, the variable inductance of the compensation circuit 104 can be configured to include different input inductance values for the different gain modes. For example, when the LNA 100 is in one of the gain modes G0, G1, G2, input inductance values can be selected for such gain modes in a manner similar to the example of FIG. 11. For the gain mode G3 where both of the single-effect and the gain mode specific effect are present, an input inductance value can be selected to compensate for both of such effects.

Thus, and as depicted in FIG. 22, the variable input inductance L of the example of FIG. 21 can be operated to result in a compensating phase profile depicted as $\Phi_{Comp}$. Such $\Phi_{Comp}$ can provide compensation for the uncompensated phase effect ($\Phi_{Uncomp}$) to result in a phase profile $\Phi$ that is, for example, substantially uniform at a reference value $\Phi_{Ref}$.

FIG. 23 shows an LNA 100 having a switchable Zg3 similar to the example of FIG. 16. However, the LNA 100 of FIG. 23 includes a phase compensation circuit 104 that can be similar to the example of FIG. 13. In some embodiments, such a compensation circuit (104 in FIG. 23) can be configured and operated to address the gain mode specific phase variation, as well as the phase variation affecting all of the gain modes.

In the example of FIG. 23, the LNA 100 can include a phase compensation circuit 104 implemented to include a variable capacitance Cc having one end coupled to the gate of Q1 and the other end coupled to the source of Q1. Thus, the variable capacitance Cc can be electrically parallel with the Cgs associated with Q1. Accordingly, the net Cgs value associated with Q1 can be a sum of Cgs and Cc, and such a net Cgs value can be adjusted by the variable capacitance Cc.

In FIG. 23, the phase compensation circuit 104 can be implemented to provide a variable capacitance Cc. Such a variable capacitance can be utilized to control how much phase shift occurs at the LNA.

More particularly, the variable capacitance of the compensation circuit 104 can be configured to include different net Cgs values for the different gain modes. For example, when the LNA 100 is in one of the gain modes G0, G1, G2, Cc values can be selected for such gain modes in a manner similar to the example of FIG. 13. For the gain mode G3 where both of the single-effect and the gain mode specific effect are present, a compensation capacitance (Cc) value can be selected to compensate for both of such effects.

Thus, and as depicted in FIG. 24, the variable capacitance Cc of the example of FIG. 23 can be operated to result in a compensating phase profile depicted as $\Phi_{Comp}$. Such $\Phi_{Comp}$ can provide compensation for the uncompensated phase effect ($\Phi_{Uncomp}$) to result in a phase profile $\Phi$ that is, for example, substantially uniform at a reference value $\Phi_{Ref}$.

In the various examples described herein in reference to FIGS. 7-15 and 18-24, a given phase compensation circuit is described as providing control of a particular electrical property (e.g., capacitance or inductance) associated with a given RF stage transistor of an LNA. Such a compensation circuit can provide compensation of a phase variation resulting from one or more portions (e.g., Cgs) associated with the RF stage transistor, an overall phase variation associated with the RF stage transistor, or any combination thereof.

In some embodiments, an LNA having one or more features as described herein can have a phase compensation circuit configured to provide control of a plurality of electrical properties associated with a given RF stage transistor. For example, and in the context of the example phase compensation techniques of FIGS. 7-15 and 18-24, a phase compensation circuit can include a combination of such techniques. For example, a phase compensation circuit can include two or more of the compensation circuits 104 associated with FIGS. 7, 11 and 13. Similarly, a phase compensation circuit can include two or more of the compensation circuits 104 associated with FIGS. 18, 21 and 23.

Figure 25:
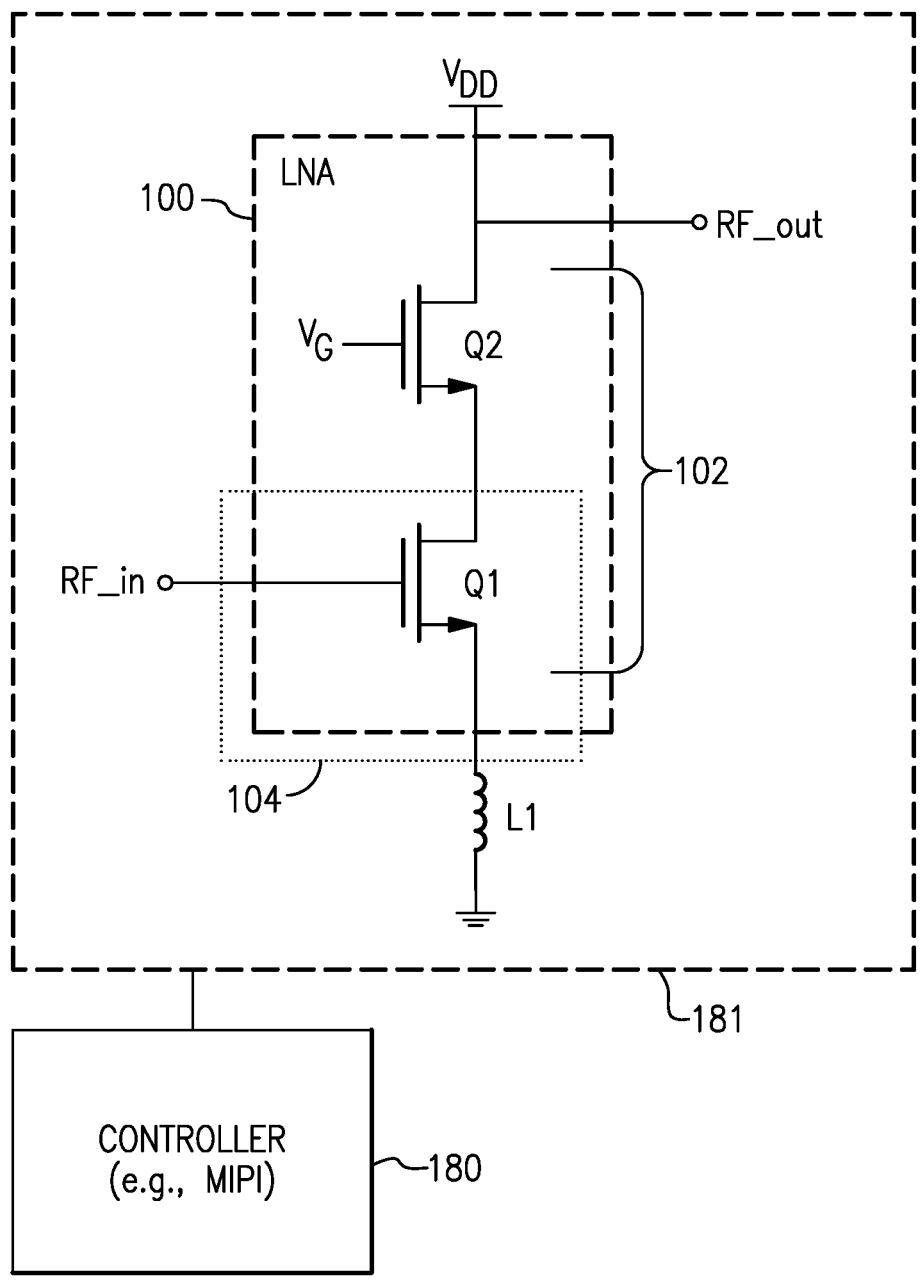
FIG. 25 shows that in some embodiments, an assembly that includes an LNA and a phase compensation circuit having one or more features as described herein, can be controlled by a controller.

FIG. 25 shows that in some embodiments, an assembly 181 that includes the LNA 100 and the phase compensation circuit 104 having one or more features as described herein, can be controlled by a controller 180. Such a controller can provide various control signals to, for example, operate the various amplification transistors and switch transistors to achieve various gain modes and to provide phase compensation for such gain modes. In some embodiments, the controller 180 can be configured to include MIPI (Mobile Industry Processor Interface) functionality.

Figure 26:
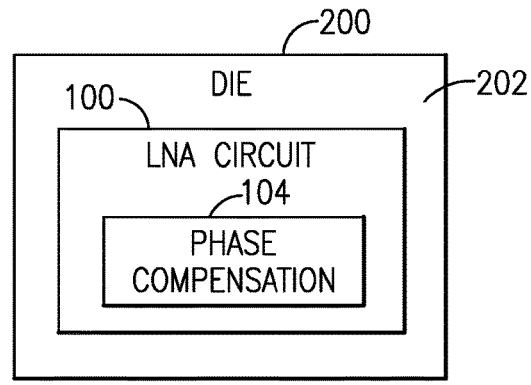
FIG. 26 shows that in some embodiments, some or all of an LNA having one or more features as described herein can be implemented on a semiconductor die.

FIG. 26 shows that in some embodiments, some or all of an LNA 100 having one or more features as described herein can be implemented on a semiconductor die 200. Such a die can include a substrate 202, and at least some of a phase compensation circuit 104 can be implemented on the substrate 202.

Figure 27:
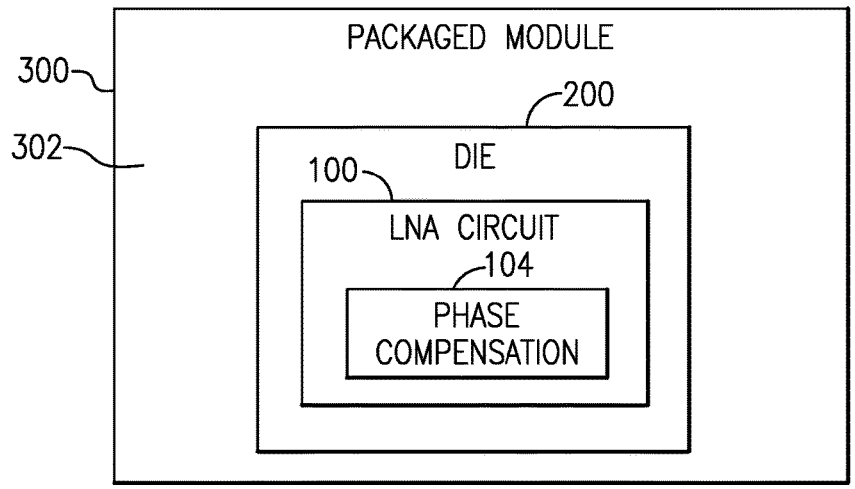
FIG. 27 shows an example where some or all of an LNA having one or more features as described herein can be implemented on a packaged module, and such a packaged module can include a semiconductor die similar to the example of FIG. 26.
Figure 28:
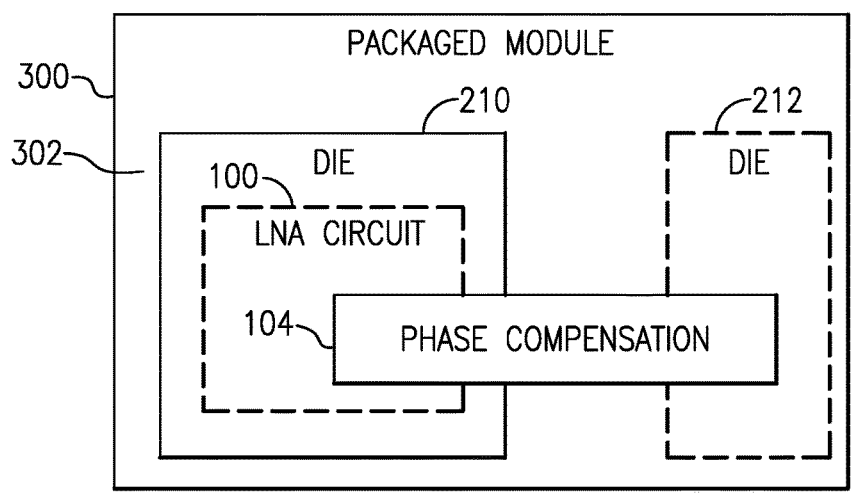
FIG. 28 shows another example where some or all of an LNA having one or more features as described herein can be implemented on a packaged module, and such a packaged module can include a plurality of semiconductor die.

FIGS. 27 and 28 show that in some embodiments, some or all of an LNA 100 having one or more features as described herein can be implemented on a packaged module 300. Such a module can include a packaging substrate 302 configured to receive a plurality of components such as one or more die and one or more passive components.

FIG. 27 shows that in some embodiments, the packaged module 300 can include a semiconductor die 200 that is similar to the example of FIG. 26. Accordingly, such a die can include some or all of the LNA 100, with at least some of a phase compensation circuit 104 being implemented on the die 200.

FIG. 28 shows that in some embodiments, the packaged module 300 can include a first semiconductor die 210 having an LNA 100 implemented thereon. In the example of FIG. 28, some of a phase compensation circuit 104 can be implemented on the first die 210, and the rest of the phase compensation circuit 104 can be implemented on another die 212, outside of a die (e.g., on the packaging substrate 302), or any combination thereof.

Figure 29:
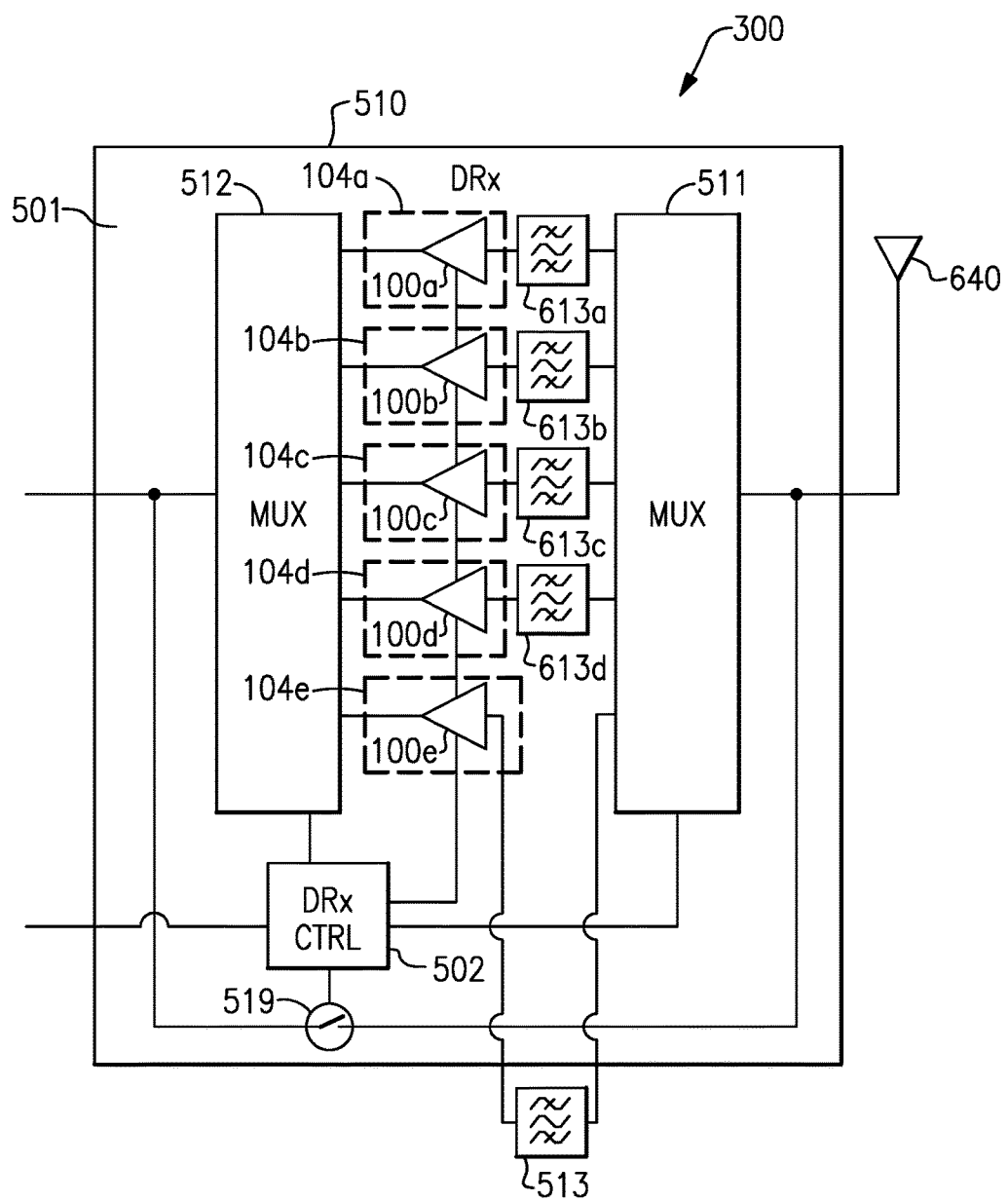
FIG. 29 shows an example of a diversity receive module that includes an LNA having one or more features as described herein.

In FIG. 29, a diversity receiver module 300 can be an example of the modules 300 of FIGS. 27 and 28. In some embodiments, such a DRx module can be coupled to an off-module filter 513. The DRx module 300 can include a packaging substrate 501 configured to receive a plurality of components and a receiving system implemented on the packaging substrate 501. The DRx module 300 can include one or more signal paths that are routed off the DRx module 300 and made available to a system integrator, designer, or manufacturer to support a filter for any desired band.

The DRx module 300 includes a number of paths between the input and the output of the DRx module 300. The DRx module 300 includes a bypass path between the input and the output activated by a bypass switch 519 controlled by the DRx controller 502. Although FIG. 29 depicts a single bypass switch 519, in some implementations, the bypass switch 519 may include multiple switches (e.g., a first switch disposed physically close to the input and a second switch disposed physically close to the output. As shown in FIG. 29, the bypass path does not include a filter or an amplifier.

The DRx module 300 includes a number of multiplexer paths including a first multiplexer 511 and a second multiplexer 512. The multiplexer paths include a number of on-module paths that include the first multiplexer 511, a bandpass filter 613a-613d implemented on the packaging substrate 501, an amplifier 100a-100d implemented on the packaging substrate 501, and the second multiplexer 512. The multiplexer paths include one or more off-module paths that include the first multiplexer 511, a bandpass filter 513 implemented off the packaging substrate 501, an amplifier 100e, and the second multiplexer 512. The amplifier 514 may be a wide-band amplifier implemented on the packaging substrate 501 or may also be implemented off the packaging substrate 501. In some embodiments, the amplifiers 100a-100d, 100e may be variable-gain amplifiers and/or variable-current amplifiers.

A DRx controller 502 is configured to selectively activate one or more of the plurality of paths between the input and the output. In some implementations, the DRx controller 502 is configured to selectively activate one or more of the plurality of paths based on a band select signal received by the DRx controller 502 (e.g., from a communications controller). The DRx controller 502 may selectively activate the paths by, for example, opening or closing the bypass switch 519, enabling or disabling the amplifiers 100a-100d, 100e, controlling the multiplexers 511, 512, or through other mechanisms. For example, the DRx controller 502 may open or close switches along the paths (e.g., between the filters 613a-613d, 513 and the amplifiers 100a-100d, 100e) or by setting the gain of the amplifiers 100a-100d, 100e to substantially zero.

In the example DRx module 300 of FIG. 29, some or all of the amplifiers 100a-100d, 100e can be provided with phase compensation circuit 104 having one or more features as described herein. For example, each of such amplifiers (100) is shown to have associated with it a phase compensation circuit 104.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 30:
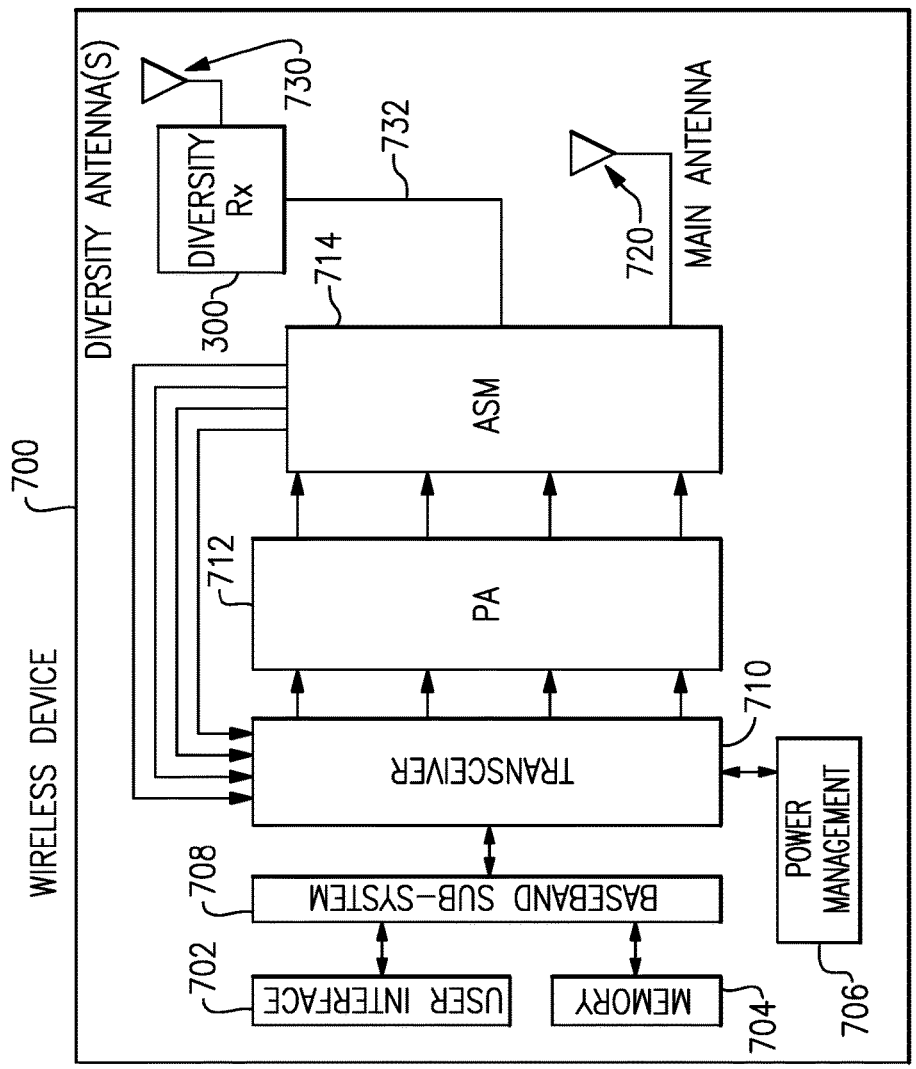
FIG. 30 depicts an example wireless device having one or more advantageous features described herein.

FIG. 30 depicts an example wireless device 700 having one or more advantageous features described herein. In some embodiments, an LNA having one or more features as described herein can be implemented in each of one or more places in such a wireless device. For example, in some embodiments, such advantageous features can be implemented in a module such as a diversity receive (DRx) module 300 having one or more low-noise amplifiers (LNAs).

In the example of FIG. 30, power amplifiers (PAs) in a PA module 712 can receive their respective RF signals from a transceiver 710 that can be configured and operated to generate RF signals to be amplified and transmitted, and to process received signals. The transceiver 710 is shown to interact with a baseband sub-system 708 that is configured to provide conversion between data and/or voice signals suitable for a user and RF signals suitable for the transceiver 710. The transceiver 710 is also shown to be connected to a power management component 706 that is configured to manage power for the operation of the wireless device 700. Such power management can also control operations of the baseband sub-system 708 and other components of the wireless device 700.

The baseband sub-system 708 is shown to be connected to a user interface 702 to facilitate various input and output of voice and/or data provided to and received from the user. The baseband sub-system 708 can also be connected to a memory 504 that is configured to store data and/or instructions to facilitate the operation of the wireless device, and/or to provide storage of information for the user.

In the example of FIG. 30, the DRx module 300 can be implemented between one or more diversity antennas (e.g., diversity antenna 730) and the ASM 714. Such a configuration can allow an RF signal received through the diversity antenna 730 to be processed (in some embodiments, including amplification by an LNA) with little or no loss of and/or little or no addition of noise to the RF signal from the diversity antenna 730. Such processed signal from the DRx module 300 can then be routed to the ASM through one or more signal paths.

In the example of FIG. 30, a main antenna 720 can be configured to, for example, facilitate transmission of RF signals from the PA module 512. In some embodiments, receive operations can also be achieved through the main antenna.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency amplifier, comprising:
   a common input node;
   a common output node; and
   a low-noise amplifier implemented in a cascode configuration between the common input node and the common output node, and including an input stage and a cascode stage, the input stage configured to operate in one of a plurality of gain settings, and to provide a compensating phase shift for a signal at each of the plurality of gain settings, the compensating phase shift selected to provide an approximately constant phase among the plurality of gain settings.

2. The radio-frequency amplifier of claim 1 wherein the input stage includes one or more transistors each having a gate for receiving the signal, a source coupled to a ground, and a drain for outputting an amplified signal, such that the transistor includes an effective input resistance, an effective input inductance L and an effective gate-source capacitance Cgs.

3. The radio-frequency amplifier of claim 2 wherein the input stage includes a plurality of transistors implemented in an electrically parallel configuration, each transistor having a Cgs value such that different net Cgs values are obtained by operation of one or more of the transistors, the different net Cgs values providing different compensating phase shifts.

4. The radio-frequency amplifier of claim 3 wherein the input stage further includes a switch implemented at the drain of each transistor to control the operation of the transistor.

5. The radio-frequency amplifier of claim 3 wherein the Cgs value of the corresponding transistor is obtained at least in part by W/L dimensions of the transistor.

6. The radio-frequency amplifier of claim 3 wherein the plurality of transistors are configured so that one transistor is operational in a lowest gain setting, and an additional transistor is operational for each increased gain setting.

7. The radio-frequency amplifier of claim 3 wherein W/L dimensions of at least one transistor are dimensioned substantially differently from W/L dimensions of other transistors to provide phase compensation for a secondary effect resulting from a gain setting specific to the at least one transistor.

8. The radio-frequency amplifier of claim 7 wherein the gain setting specific to the at least one transistor is a lowest gain setting, and the corresponding transistor has W/L dimensions that are substantially smaller than those of the other transistors.

9. The radio-frequency amplifier of claim 2 wherein at least one transistor of the input stage is configured such that its effective input inductance L includes a variable inductance.

10. The radio-frequency amplifier of claim 9 wherein the variable inductance is configured to include a range of L values to obtain the compensating phase shift for the signal at each of the plurality of gain settings.

11. The radio-frequency amplifier of claim 2 wherein at least one transistor of the input stage is configured to include a variable capacitance between the gate and the source.

12. The radio-frequency amplifier of claim 11 wherein the variable capacitance is configured to provide a range of Cgs values to obtain the compensating phase shift for the signal at each of the plurality of gain settings.

13. A semiconductor die having a radio-frequency circuit, comprising:
   a substrate; and
   a low-noise amplifier implemented in a cascode configuration on the substrate between a common input node and a common output node, the low-noise amplifier including an input stage and a cascode stage, the input stage configured to operate in one of a plurality of gain settings, and to provide a compensating phase shift for a signal at each of the plurality of gain settings, the compensating phase shift selected to provide an approximately constant phase among the plurality of gain settings.

14. The semiconductor die of claim 13 wherein the substrate includes a silicon-on-insulator substrate.

15. A radio-frequency module comprising:
   a packaging substrate configured to receive a plurality of components; and
   a low-noise amplifier implemented in a cascode configuration on the packaging substrate between a common input node and a common output node, the low-noise amplifier including an input stage and a cascode stage, the input stage configured to operate in one of a plurality of gain settings, and to provide a compensating phase shift for a signal at each of the plurality of gain settings, the compensating phase shift selected to provide an approximately constant phase among the plurality of gain settings.

* * * * *